United States Patent
Sakano et al.

(10) Patent No.: US 7,345,308 B2
(45) Date of Patent: Mar. 18, 2008

(54) SOLID-STATE IMAGING DEVICE

(75) Inventors: Yorito Sakano, Fujimi (JP); Akira Mizuguchi, Turuoka (JP); Noriyuki Nakamura, Sakata (JP)

(73) Assignee: Seiko Epson Corporation (JP)

( * ) Notice: Subject to any disclaimer, the term of this patent is extended or adjusted under 35 U.S.C. 154(b) by 44 days.

(21) Appl. No.: 11/379,879

(22) Filed: Apr. 24, 2006

(65) Prior Publication Data

US 2006/0290659 A1 Dec. 28, 2006

(30) Foreign Application Priority Data

May 13, 2005 (JP) ............... 2005-140734

(51) Int. Cl.
*H01L 29/04* (2006.01)
(52) U.S. Cl. .............. 257/59; 257/72; 257/351; 257/E27.1
(58) Field of Classification Search ........ 257/291, 257/292, 294, 249, 197, E27.1, E27.125, 257/59, 72, 350, 351, 352
See application file for complete search history.

(56) References Cited

U.S. PATENT DOCUMENTS 6,274,887 B1* 8/2001 Yamazaki et al. ........... 257/72

2005/0082629 A1* 4/2005 Murakami ................ 257/437

FOREIGN PATENT DOCUMENTS

| JP | 2935492 | 7/1999 |
|---|---|---|
| JP | 2001-177085 | 6/2001 |
| JP | 2004-241487 | 8/2004 |

* cited by examiner

*Primary Examiner*—Howard Weiss
*Assistant Examiner*—(Vikki) Hoa B Trinh
(74) *Attorney, Agent, or Firm*—Harness, Dickey & Pierce, P.L.C.

(57) ABSTRACT

A solid-state imaging device includes: a photoelectric conversion element; a pixel region including a modulation part formed adjacent to the photoelectric conversion element; and a peripheral region in which a peripheral circuit including a driving circuit driving the photoelectric conversion element and the modulation part is disposed, wherein the peripheral region includes a transistor that a sidewall is formed on a side of a gate electrode; and the pixel region includes a transistor that no sidewall is formed on a side of a gate electrode.

3 Claims, 14 Drawing Sheets

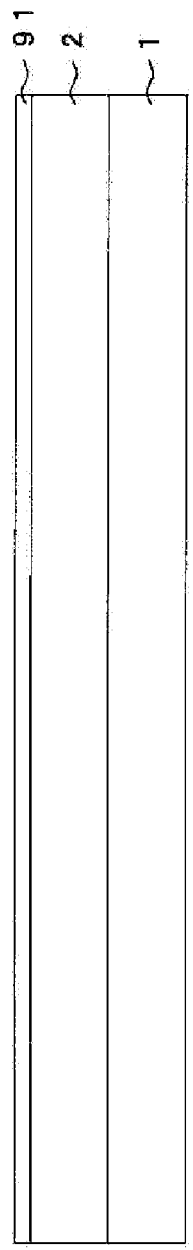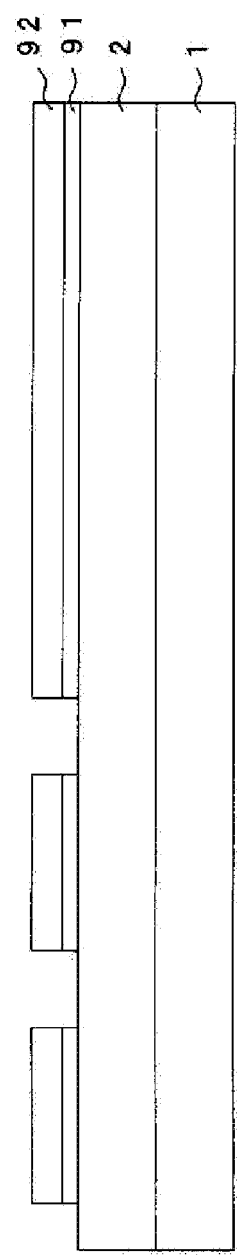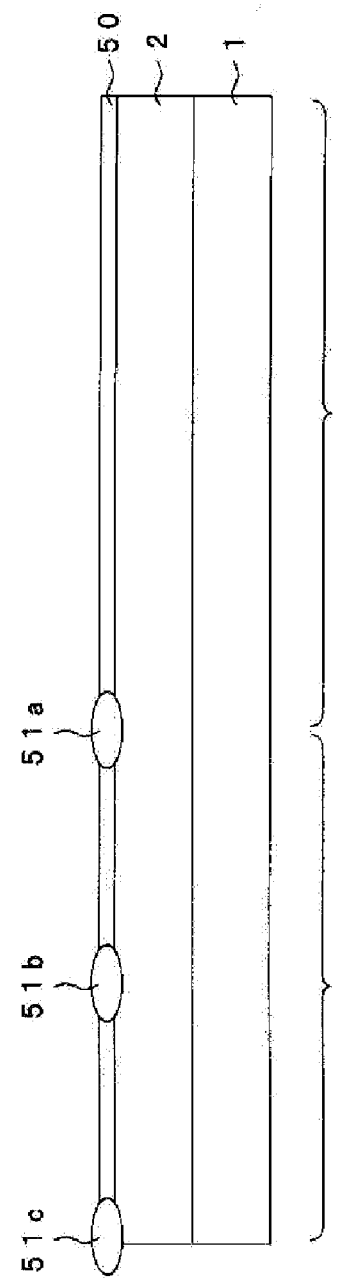

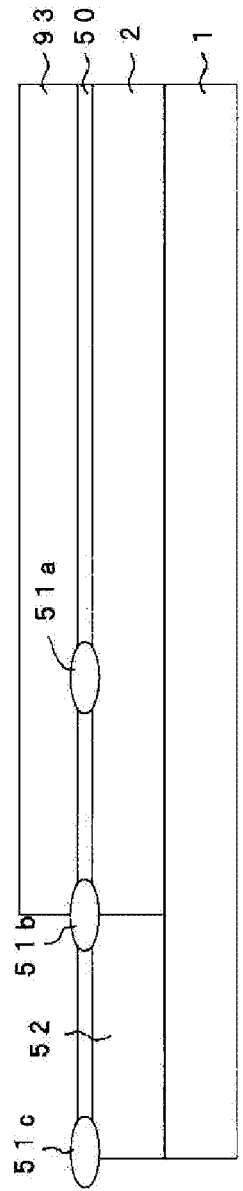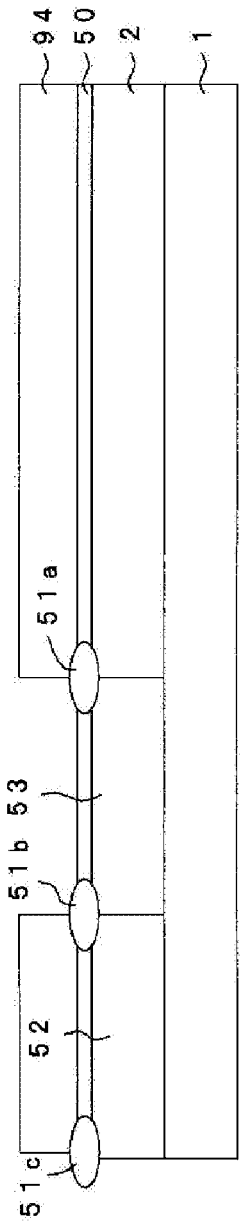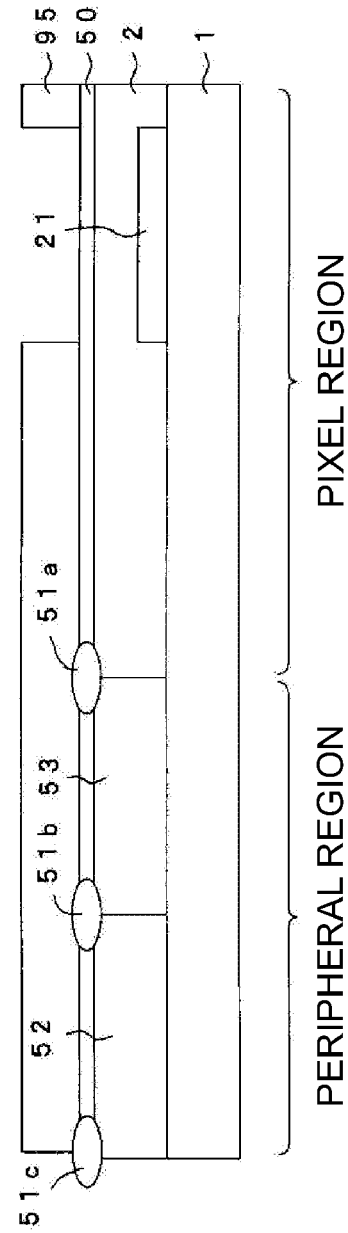

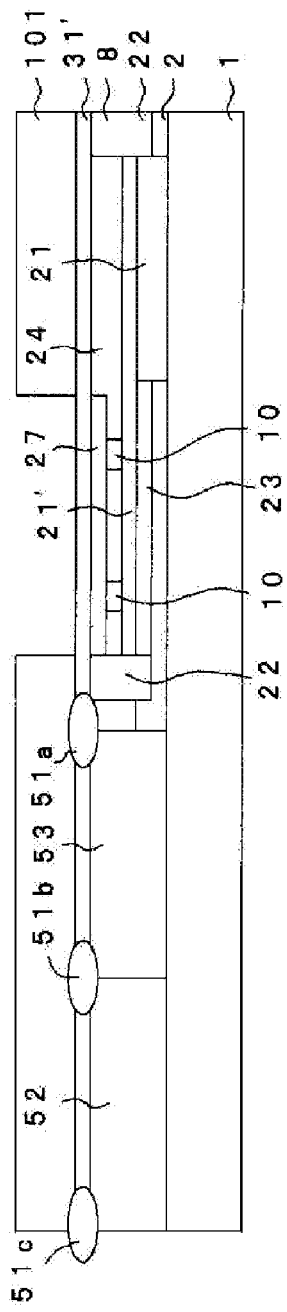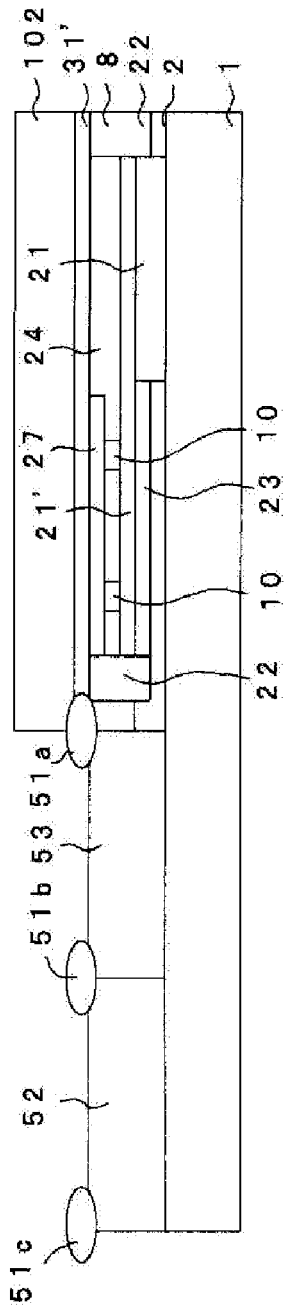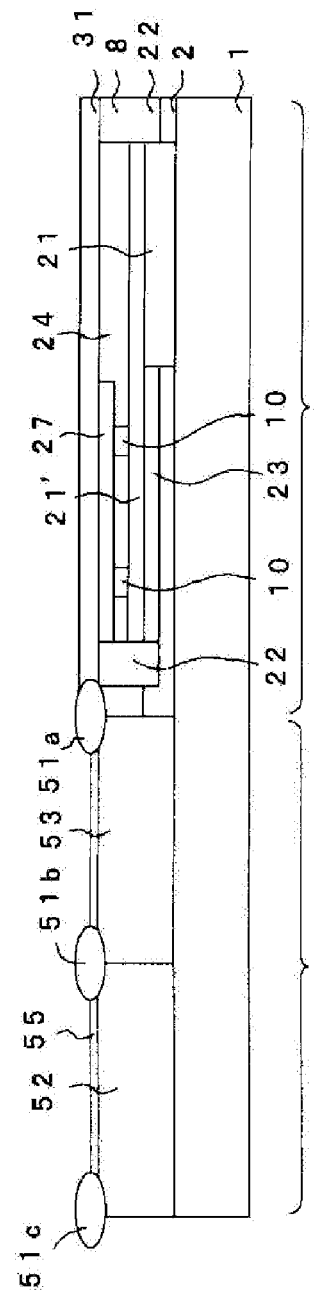

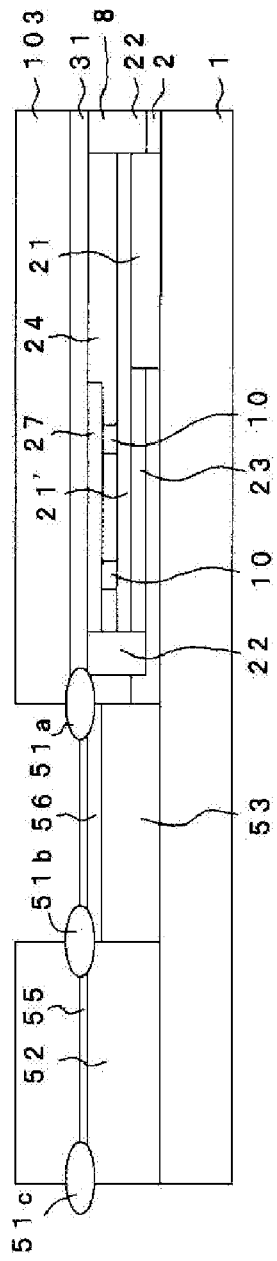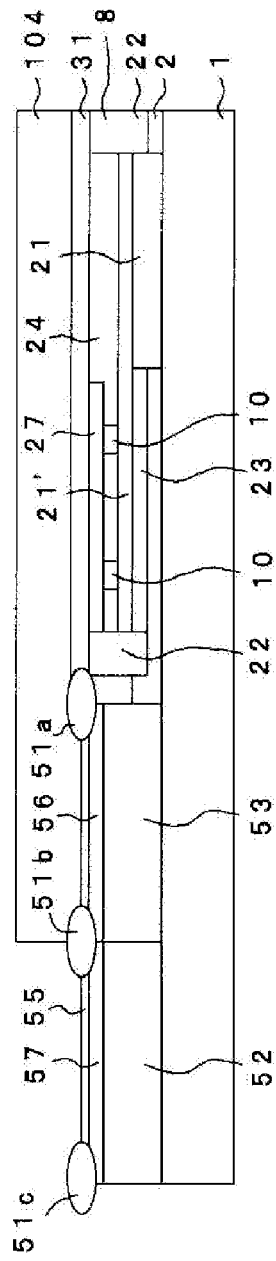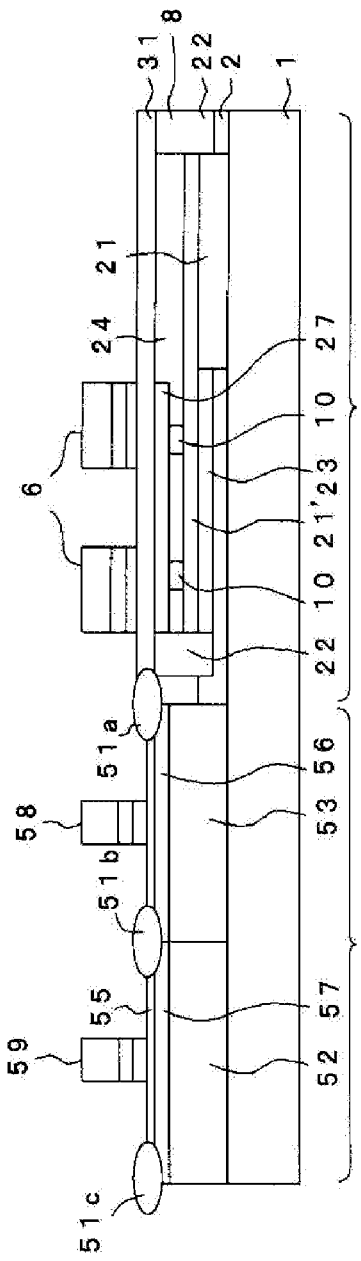

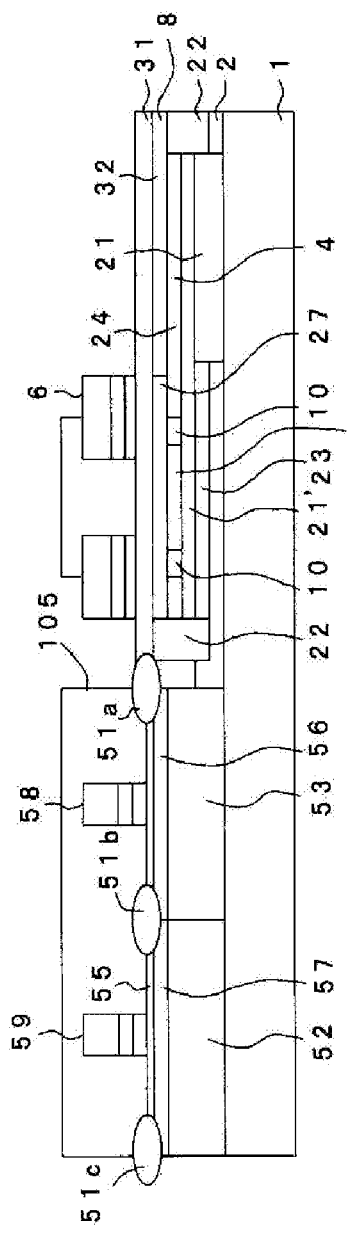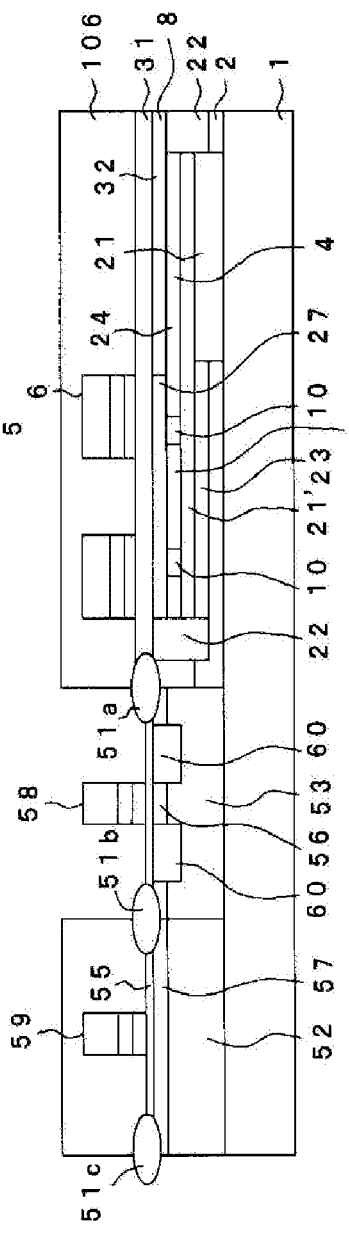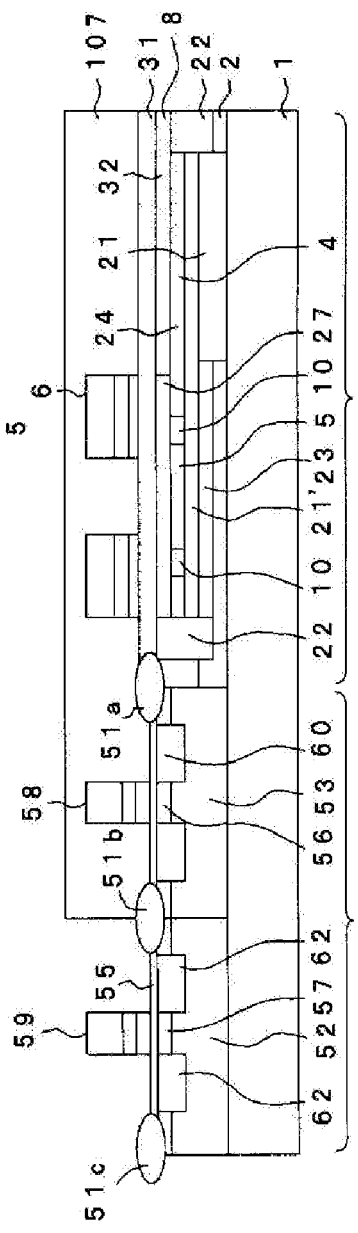

SOLID-STATE IMAGING DEVICE

The entire disclosure of Japanese Patent Application No. 2005-140734, filed May 13, 2005 is expressly incorporated by reference herein.

BACKGROUND

1. Technical Field

The present invention relates to a solid-state imaging device having a high quality image and low power consumption.

2. Related Art

As solid-state imaging devices mounted in cellular phones and so forth, there are a charge coupled device (CCD) type image sensor and a CMOS type image sensor. The CCD type image sensor is excellent in image quality, while the CMOS type image sensor consumes lower power and its process cost is low. In recent years, MOS type solid-state imaging devices using a threshold voltage modulation method that combines both high quality image and low power consumption have been proposed. The MOS type solid-state imaging device of the threshold voltage modulation method is disclosed in Japanese Unexamined Patent Publication No. 2001-177085, for example.

In an image sensor, image output is obtained by arranging sensor cells in a matrix and repeating three states of initialization, accumulation and reading. In the image sensor disclosed in Japanese Unexamined Patent Publication No. 2001-177085, each unit pixel has a photo-diode for accumulation and a transistor for reading.

FIG. 15 schematically shows a sectional view of the image sensor disclosed in Japanese Unexamined Patent Publication No. 2001-177085.

In the image sensor shown in FIG. 15, in each unit pixel, a photo-diode 111 and an insulated gate field effect transistor 112 are disposed adjacently to each other on a substrate 120. A gate electrode 113 of the transistor 112 is formed in a ring shape, and a source region 114 is formed at the center of the opening portion of the gate electrode 113. A drain region 115 is formed at the periphery of the gate electrode 113.

Charges (photo-generated charges) generated by light incident through an opening region of the photo-diode 111 are transferred to a P-type well region 116 under the gate electrode 113, and accumulated in a carrier pocket 117 formed in this section. The threshold voltage of the transistor 112 changes by photo-generated charges accumulated in the carrier pocket 117. Thus, a signal (pixel signal) corresponding to incident light is obtained from the source region 114 of the transistor 112.

Incidentally, in order to reduce degradation of device characteristics caused by hot electron injection and so forth, a transistor formed on the substrate has an light doped drain (LDD) structure. The LDD structure lowers an impurity concentration of a channel near a gate electrode, compared to the impurity concentration of the channel near a source-drain.

In order to adopt such an LDD structure, a sidewall is formed on a side wall of a gate electrode. By using the gate electrode before the sidewall is formed as a mask, ion-implantation with a low impurity concentration is implemented, and by using the gate electrode after the sidewall is formed as a mask, ion-implantation with a high impurity concentration is implemented.

In order to form such a sidewall on the side wall of the gate electrode, an anisotropic etching is performed after an oxide film and so forth, which becomes a material for the sidewall, is deposited on the entire surface of the substrate.

But there is a problem in that defects may occur in a sensor cell due to damage in the substrate caused by performing the anisotropic etching.

SUMMARY

An advantage of the present invention is to provide a solid-state imaging device that can prevent the occurrence of damage in the pixel region by only forming a sidewall in a transistor in a peripheral region at the periphery of a pixel region.

A solid-state imaging device according to the invention includes a pixel region that have a photoelectric conversion element and a modulation part formed adjacent to the photoelectric conversion element, and a peripheral region in which a peripheral circuit including a driving circuit that drives the photoelectric conversion element and the modulation is disposed, and the peripheral region has a transistor that a sidewall is formed on a side surface of a gate electrode, and the pixel region has a transistor that a sidewall is not formed on a side surface of a gate electrode.

In such a structure, the photoelectric conversion element and the modulation are formed in the pixel region. Further, in the peripheral region, the peripheral circuit including the driving circuit that drives the photoelectric conversion element and the modulation is disposed. The peripheral region has the transistor that the sidewall is formed on the side surface of the gate electrode, and the pixel region has the transistor that the sidewall is not formed on the side surface of the gate electrode. In other words, by using the sidewall, the peripheral region obtains the transistor having an LDD structure. Meanwhile, the sidewall is not formed in the transistor in the pixel region. Accordingly, in the pixel region, etching is not performed to form the sidewall so that the substrate will not be damaged. Thus the occurrence of defects in the pixel region can be prevented.

Further, the pixel region includes: a substrate of one conductivity type; a first impurity layer of a reverse conductivity type that is formed on the substrate; a second impurity layer of one conductivity type that is formed on the first impurity layer in a forming region of the photoelectric conversion element; a third impurity layer of one conductivity type that is formed on the first impurity layer in a forming region of a transistor and to which photo generated charges are transferred from the second impurity layer; a gate electrode formed above the third impurity layer above the substrate, which gate electrode has an opening and no sidewall on a side surface thereof; a source formed on the substrate surface side in the opening, and a drain formed apart from the source and electrically coupled to the first impurity layer.

In such a structure, photo-generated charges that are generated in the first impurity layer of the photoelectric conversion element forming region are transferred from the second impurity layer to the third impurity layer. A threshold voltage of a channel of the transistor is controlled by photo-generated charges transferred to the third impurity layer, and a pixel signal corresponding to photo-generated charges is output from the transistor. The sidewall is not formed on the gate electrode that constitutes the transistor. Thus, in the pixel region, as etching is not performed to form the sidewall, the substrate is not damaged by etching. Thus the occurrence of defects can be prevented.

Further, the gate electrode is formed in a ring-shape.

Furthermore, a fourth impurity layer that is formed under the gate electrode in the third impurity layer so as to be highly doped than the third impurity layer.

In such a structure, photo-generated charges can be transferred under the gate electrode without fail and the modulation efficiency can be improved.

BRIEF DESCRIPTION OF THE DRAWINGS

The invention will be described with reference to the accompanying drawings, wherein like numbers refer to like elements and wherein:

FIG. 5 is a process diagram for illustrating the method of manufacturing an element.

FIG. 6 is a process diagram for illustrating the method of manufacturing an element.

FIG. 9 is a process diagram for illustrating the method of manufacturing an element.

FIG. 10 is a process diagram for illustrating the method of manufacturing an element.

FIG. 11 is a process diagram for illustrating the method of manufacturing an element.

DESCRIPTION OF EXEMPLARY EMBODIMENTS

Figure 1:
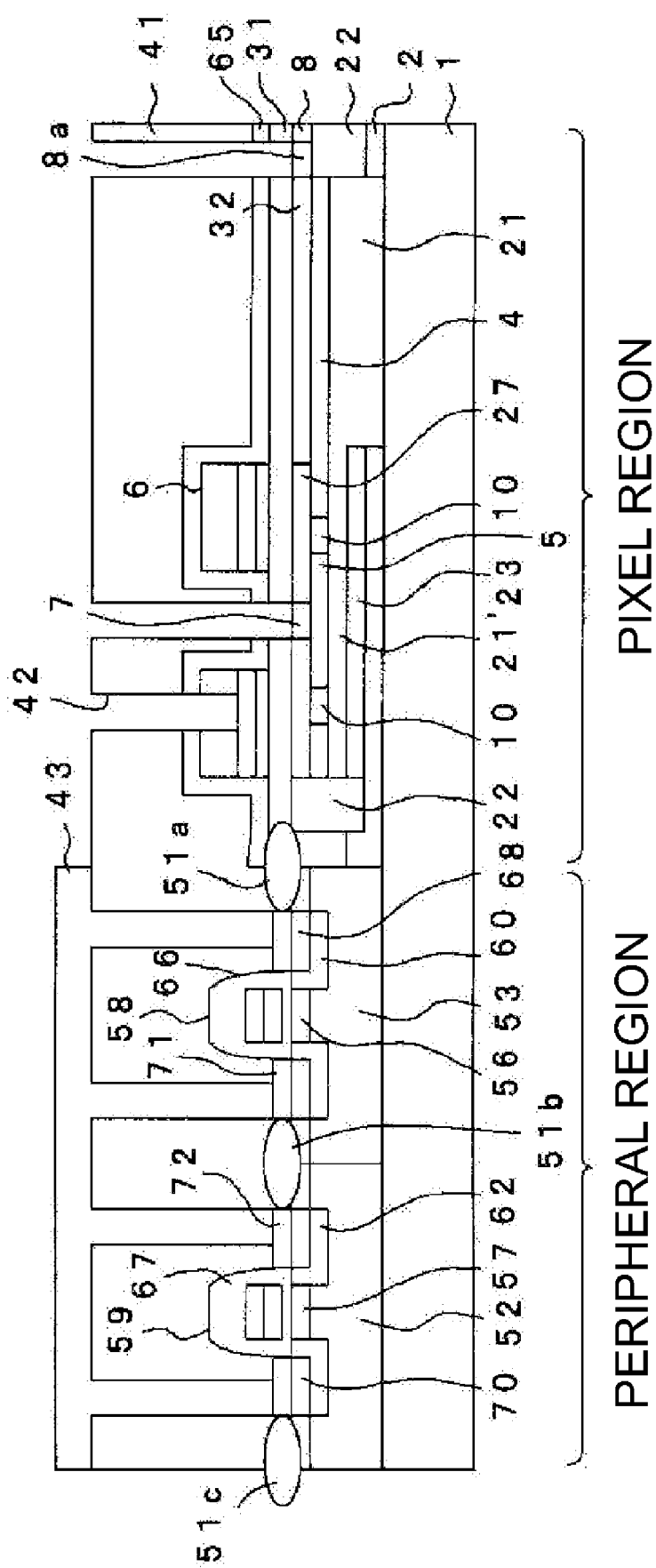
FIG. 1 is a sectional view showing a solid-state imaging device according to an embodiment of the invention.
Figure 2:
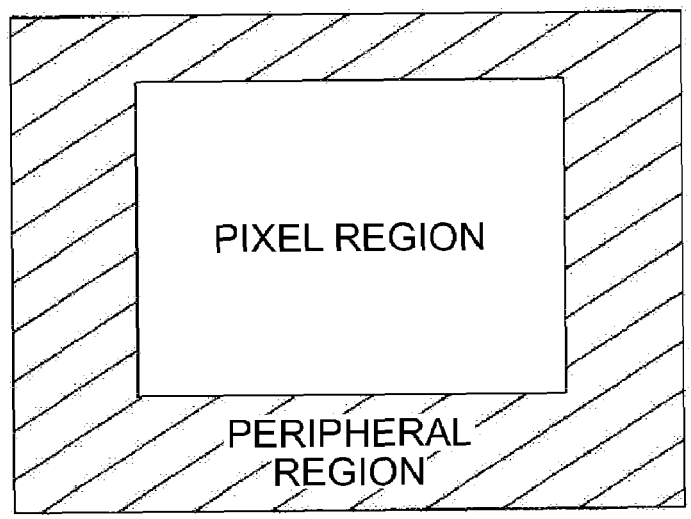
FIG. 2 is an explanatory diagram illustrating a pixel region and a peripheral region of a solid-state imaging device according to the embodiment of the invention.
Figure 3:
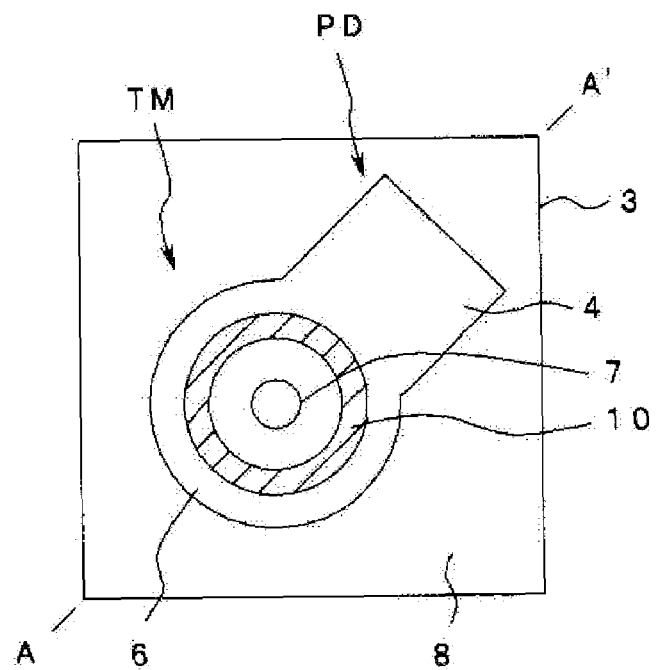
FIG. 3 is a plan view showing the planar shape of one sensor cell of a solid-state imaging device according to the embodiment of the invention.
Figure 4:
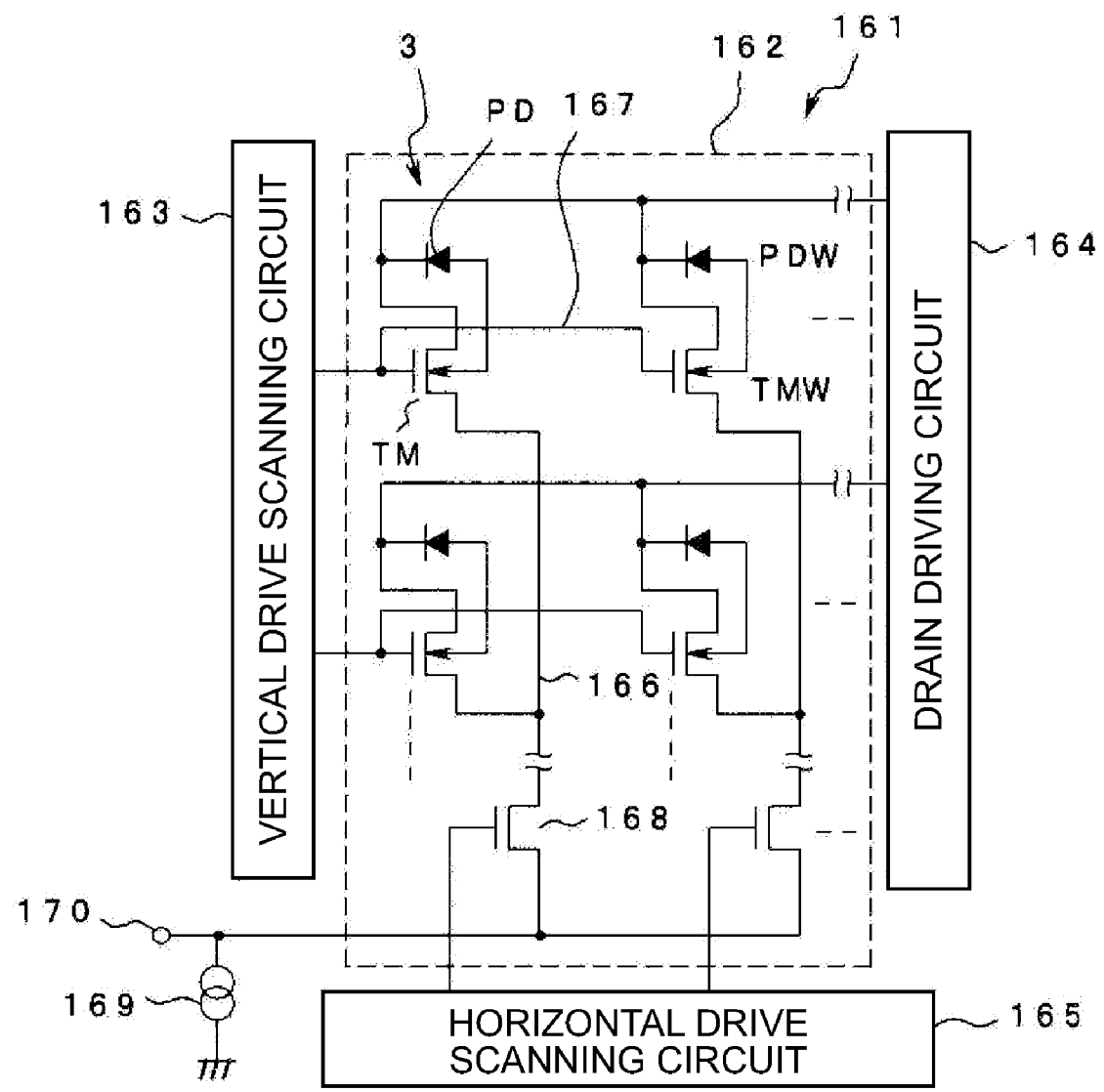
FIG. 4 is a circuit block diagram showing the entire structure of an element by an equivalent circuit.

Embodiments of the present invention will now be described in detail below with reference to the drawings. FIG. 1 through FIG. 14 relate to an embodiment according to the present invention. FIG. 1 is a sectional view schematically showing a cross-section of a solid-state imaging device according to the present embodiment. FIG. 2 is an explanatory diagram illustrating a pixel region and a peripheral region of the solid-state imaging device according to the present embodiment. FIG. 3 is an explanatory diagram showing a planar shape of one sensor cell of the solid-state imaging device according to the present embodiment. Further, FIG. 1 is a sectional view showing a part of a section taken along the line A-A' of FIG. 3. FIG. 4 is a circuit block diagram showing the entire structure of an element by an equivalent circuit. FIG. 5 through FIG. 14 are process diagrams for illustrating a method of manufacturing. Further, in the above drawings, the scale of each layer and each member are different, for the purpose of making each layer and each member large enough to be recognizable in the drawings.

Structure of Sensor Cell

The solid-state imaging device according to the present embodiment has a sensor cell array in which sensor cells, which are unit pixels, are arranged in a matrix. FIG. 2 shows an arrangement of the sensor cell array. The sensor cell array, as shown in FIG. 2, is arranged approximately in the middle of a pixel region, and the periphery of the sensor cell array is a peripheral region (in dashed lines). Various peripheral circuits such as a driving circuit, a digital converter and so forth are disposed in the peripheral region.

Each sensor cell collects and accumulates photo-generated charges generated corresponding to incident light, and outputs a pixel signal of a level based on the accumulated photo-generated charges. By arranging the sensor cells in a matrix, image signals of one screen are obtained.

First, the structure of each sensor cell will be described with reference to FIG. 1 and FIG. 3. With an element isolation region 51a by LOCOS, a substrate 1 is separated into a pixel region and a peripheral region. FIG. 3 shows a planar shape of one sensor cell. A sectional view shown in FIG. 1, from the element isolation region 51a to the right side of the figure, shows a sectional structure of the cell taken along the line A-A' in FIG. 3. Meanwhile, in the present embodiment, an example is shown in which holes are used as photo-generated charges. In the case of using electrons as photo-generated charges, the same configuration is also possible.

As shown in the plan view of FIG. 3, a photo-diode PD and a modulation transistor TM are adjacently formed in a sensor cell 3, which is a unit pixel. As the modulation transistor TM, for example, an N-channel depletion MOS transistor is used.

In the photo-diode PD forming region, which is a photoelectric conversion element forming region, an opening region to transmit light is formed at a stage a wiring layer is formed on the surface of the substrate 1. In a relatively shallow position of the substrate 1 surface, a collection well 4, which is a P-type well that is wider in region than the opening region, and collects photo-generated charges generated by the photoelectric conversion element as a second impurity layer, is formed. On the collection well 4, an N-type diffusion layer 32, which also functions as a pinning layer, is formed above the substrate 1 surface.

In approximately the same depth as the substrate in the collection well 4, a modulation well 5 is formed, which is a P-type well in the modulation transistor TM forming region, and a third impurity layer that control the modulation transistor TM by transferring photo-generated charges collected in the collection well 4.

Above the modulation well 5, a ring-shaped gate (ring gate) 6 is formed on the substrate 1 surface, and a source region 7, which is a highly doped N-type region, is formed near the substrate 1 surface region of the opening portion at the center of the ring gate 6. Meanwhile, in FIG. 3, the ring gate 6, a carrier pocket and so forth which hereinafter be described, are shown in circles, but they may be shown in any polygon, such as ovals or octagons. An N-type drain region 8 is formed at the periphery of the ring gate 6. At a predetermined position in the drain region 8, a drain contact region 8a of an N☐ layer is formed near the substrate 1 surface.

The modulation well 5 is to control the threshold voltage of a channel in the modulation transistor TM. In the modulation well 5, a carrier pocket 10 (dashed lines in FIG. 3) as a fourth impurity layer, which is a P-type high doped region, is formed under the ring gate 6. The modulation transistor TM is made up of the modulation well 5, the ring gate 6, the source region 7, and the drain region 8, and the threshold voltage of the channel thereof changes corresponding to the charges accumulated in the modulation well 5 (carrier pocket 10).

When the drain region 8, N-type wells 21 and 21' which will be described later, and a diffusion layer 32 are biased to positive electrical potential by applying a drain voltage, a depletion layer spreads out to the entire and the periphery of the collection well 4, from the boundary surface between the diffusion layer 32 and the collection well 4, and from the boundary surface between the N-type well 21 as a first impurity layer and the collection well 4, in an area under an opening region of the photo-diode PD. In a depletion region, photo-generated charges are to be generated by light entered through the opening region. And as described above, generated photo-generated charges are to be collected in the collection well 4.

The charges collected in the collection well 4 are transferred to the modulation well 5 so as to be held in the carrier pocket 10. Thus, the source potential in the modulation transistor TM becomes one corresponding to the amount of the charges transferred to the modulation well 5, which is, corresponding to the light incident upon the photo-diode PD.

Circuit Configuration of the Entire Device

Next, the circuit configuration of the entire solid-state imaging device according to the present embodiment will be described with reference to FIG. 4.

A solid-state imaging device 161 has a sensor cell array 162 including the sensor cells 3 of FIG. 3, and circuits 163 through 165 that drive each of the sensor cells 3 in the sensor cell array 162. The sensor array 162 is disposed in the pixel region, while the circuits 163 through 165 are disposed in the peripheral region. The sensor cell array 162 is formed by arranging the cells 3 in a matrix. The sensor cell array 162 includes, for example, the cells 3 of 640×480 and a region (OB region) for optical black (OB). When the OB region is included, the sensor cell array 162 is made up of, for example, the cells 3 of 712×500.

Each of the sensor cells 3 includes a photo-diode PD that performs photoelectric conversion and a modulation transistor TM for detecting and reading an optical signal. The photo-diode PD generates charges (photo-generated charges) corresponding to incident light, and collects the generated charges in the collection well 4 (corresponding to a coupling point PDW in FIG. 4). The photo-generated charges collected in the collection well 4 are transferred to the carrier pocket 10 in the modulation well 5 (corresponding to a coupling point TMW in FIG. 4) used for modulating the threshold in the modulation transistor TM, and held therein.

In the modulation transistor TM, since the holding of the photo-generated charges in the carrier pocket 10 is equivalent to that the back gate bias thereof is changed, the threshold voltage of a channel changes corresponding to the amount of the charges in the carrier pocket 10. Accordingly, the source voltage in the modulation transistor TM becomes one corresponding to the charges in the carrier pocket 10, that is, the brightness of the light incident upon the photo-diode PD.

Thus, each cell 3 exhibits the operations of accumulation, transfer, reading, discharge, and so forth by applying a driving signal to the ring gate 6, the source region 7, and the drain region 8 in the modulation transistor TM. As shown in FIG. 4, a signal is provided to each part of the cells 3 from a vertical drive scanning circuit 163, a drain driving circuit 164, and a horizontal drive scanning circuit 165. The vertical drive scanning circuit 163 provides scanning signals to a gate line 167 of each row, and the drain driving circuit 164 applies the drain voltage to the drain region 8 of each column. Furthermore, the horizontal drive scanning circuit 165 provides a driving signal to a switch 168 that is coupled to each source line 166.

Each cell 3 is provided corresponding to the intersection between a plurality of source lines 166 arranged in the vertical direction and a plurality of gate lines 167 arranged in the horizontal direction with respect to the sensor cell array 162. In each cell 3 of each line arranged in the horizontal direction, the ring gate 6 in the modulation transistor TM is coupled to the common gate line 167, and in each cell 3 of each column arranged in the vertical direction, the source in the modulation transistor TM is coupled to the common source line 166.

By providing an ON signal (selected gate voltage) to one of the plurality of gate lines 167, each cell commonly coupled to the gate line 167 to which the ON signal is provided is simultaneously selected, and outputs a pixel signal from each source of these selected cells through each source line 166. The vertical drive scanning circuit 163 provides ON signals to the gate lines 167 with sequentially shifting the signals in one frame period. The pixel signals from each cell of the line to which the ON signal is provided are simultaneously read from each source line 166 by one line, so as to be provided to each switch 168. The pixel signals from one line are sequentially output (line-output) for every pixel from the switch 168 by the horizontal drive scanning circuit 165.

The switch 168 coupled to each source line 166 is coupled to an image signal output terminal 170 via a common constant current source (load circuit) 169. A source in the modulation transistor TM of each sensor cell 3 is coupled to the common constant source 169, and a source follower circuit of the sensor cell 3 is formed.

Section of Sensor Cell

Next, with reference to FIG. 1, the sectional structure of the sensor cell 3 formed in a pixel region, and also as an example of a circuit formed in a peripheral region, the sectional structure of a CMOS transistor will be described in detail.

In the pixel region, an isolation region 22 is provided between a photo-diode PD forming region and a modulation transistor TM forming region between adjoining cells. At a relatively deep position in the substrate 1, N-type wells 21 and 21' are formed over the entire substrate 1 of P-type as a first impurity layer. On the N-type well 21 in the photo-diode forming region, the collection well 4 of P-type is formed. On the surface side of the substrate on the collection well 4, the diffusion layer 32 of N-type that also functions as a pinning layer is formed. The N-type well 21 is formed at a relatively deep position on the substrate.

Meanwhile, in the modulation transistor TM forming region, a P-type buried layer 23 is formed on the substrate 1. By the P-type buried layer 23, the N-type well 21' is restricted to a relatively shallow position on the substrate. On the N-type well 21' on the P-type buried layer 23, the modulation well 5 of P-type is formed. The carrier pocket 10 is formed in the modulation well 5.

The carrier pocket 10, which is under the ring gate 6, is formed in a ring-shape two-dimensionally. The carrier pocket 10 is a relatively highly doped diffusion layer by P□ diffusion.

In the modulation transistor TM forming region, the ring gate 6 having a ring-shape is formed via a gate oxide film 31 on the substrate surface. An N-type diffusion layer 27 that forms a channel is formed under the ring gate 6.

An N+ diffusion layer is formed on the substrate surface at the center of the ring gate 6 so as to form the source region 7. Further, an N-type diffusion layer is formed on the substrate surface at the periphery of the ring gate 6 so as to form the drain region 8. The N-type diffusion layer 27 that forms a channel is electrically coupled to the source region 7 and the drain region 8. Furthermore, the isolation region 22 is electrically coupled to the N-type wells 21 and 21', and to the drain region 8.

Meanwhile, in the periphery region, a CMOS transistor is formed between element isolation regions 51a and 51c. An NMOS transistor which constitutes the CMOS transistor is formed between element isolation regions 51a and 51b. And a PMOS transistor which constitutes the CMOS transistor is formed between element isolation regions 51b and 51c.

In the NMOS transistor forming region between the element isolation regions 51a and 51b, an N-type well 52 is formed in an epitaxial layer 2 on the substrate 1. A gate 58 is formed on the substrate surface above the N-type well 52. A sidewall 66 is formed at the side of the gate 58. A channel 56 is formed on the substrate surface under the gate 58, and a source region and a drain region 60 are formed on both sides of the channel 56. On the substrate surface separated from the gate 58 in the source region and the drain region 60, a contact layer 68 having an LDD structure is formed in self-alignment, using the sidewall 66 as a mask. A metal material 71 is formed on the contact layer 68 to be silicided.

Similarly, in the transistor forming region between the element isolation regions 51b and 51c, a P-type well 53 is formed in the epitaxial layer 2 on the substrate 1. A gate 59 is formed on the substrate surface of the P-type well 53. A sidewall 67 is formed on the side surface of the gate 59. A channel 57 is formed on the substrate surface under the gate 59, and a source region and a drain region 62 are formed on both sides of the channel 57. On the substrate surface separated from the gate 59 in the source region and the drain region 62, a contact layer 70 having an LDD structure is formed in self-alignment, using the sidewall 67 as a mask. A metal material 72 is formed on the contact layer 70 to be silicided.

Thus, the sidewall is formed at the gate of the transistor disposed in the peripheral region. On the other hand, according to the present embodiment, the sidewall is not formed in the transistor formed in the pixel region. That is, as shown in FIG. 1, an oxide film 65 which becomes a material for the sidewall to make the transistor having an LDD structure in the peripheral region is deposited on the ring gate 6 and the photo-diode PD forming region.

In the peripheral region, the oxide film 65 that became a material for the sidewall is anisotropically etched on the sides of the gate 58 and 59, and the sidewalls 66 and 67 are formed in this section. Whereas, in the pixel region, the oxide layer 65 remains without being etched on the side and the top surface of the ring gate 6, the section of the substrate surface at the center opening of the ring gate 6 excluding a contact hole 42, and in the photo-diode PD forming region.

Thus, according to the present embodiment, the sidewalls 66 and 67 are only formed in the transistor in the peripheral region other than the pixel region, and not formed in the pixel region.

Therefore, according to the present embodiment, the etching process that can damage the substrate is not used, therefore the occurrence of defects in a sensor cell can be prevented.

Furthermore, in the pixel region and the peripheral region, an interlayer insulation film 41 is formed on the substrate 1. In the interlayer insulation film 41, the contact hole 42 is opened to electrically couple the transistor in the pixel region to the transistor and so forth in the peripheral region. A wiring material 43 is buried in the contact hole 42 in the peripheral region, and coupled to each source region and drain region of the NMOS transistor and the PMOS transistor.

Process

Next, a method of manufacturing an element will be described with reference to process diagrams shown in FIG. 5 through FIG. 14. In FIG. 5 through FIG. 14, arrowheads above the substrate indicate that ions are implanted.

As shown in FIG. 5A, the epitaxial layer 2 of P-type is grown on the P substrate 1 of P-type prepared, and forms a pad oxide film 91 on the epitaxial layer 2 of P-type. Next, as shown in FIG. 5B, after forming a nitride film 92 on the pad oxide film 91 as an antioxidant film, the pad oxide film 91 and the nitride film 92 in an element isolation region are removed.

Next, as shown in FIG. 5C, as well as forming element isolation regions 51a to 51c by LOCOS, a sacrificial oxide film 50 is to be formed by thermal oxidation. The element isolation region 51a is to separate a pixel region and a peripheral region. A sensor cell and so forth are placed in the pixel region, and a driving circuit and so forth to drive the sensor cell are placed in the peripheral region.

FIG. 5 through FIG. 8 are showing examples of forming a CMOS transistor between the element isolation regions 51a and 51c in the peripheral region. An NMOS transistor forming region is between the element isolation regions 51a and 5ib, and a PMOS transistor forming region is between the element isolation regions 51b and 51c.

Next, a resist mask 93 is formed in a region other than the PMOS transistor forming region, and by introducing an N-type impurity into the epitaxial layer 2, the N-type well 52 is formed on the PMOS transistor forming region (FIG. 6A). Next, a resist mask 94 is formed in a region other than the NMOS transistor forming region, and by introducing a P-type impurity in the epitaxial layer 2, the P-type well 53 is formed in the NMOS transistor forming region (FIG. 6B).

Next, as shown in FIG. 6C, a resist mask 95 is formed in a section other than a photo-diode forming region in the pixel region, and for example, phosphorus (P) is ion-implanted to form an N-type well 21. This ion-implantation is to be done to a relatively deep position in the photo-diode forming region.

Figure 7A:
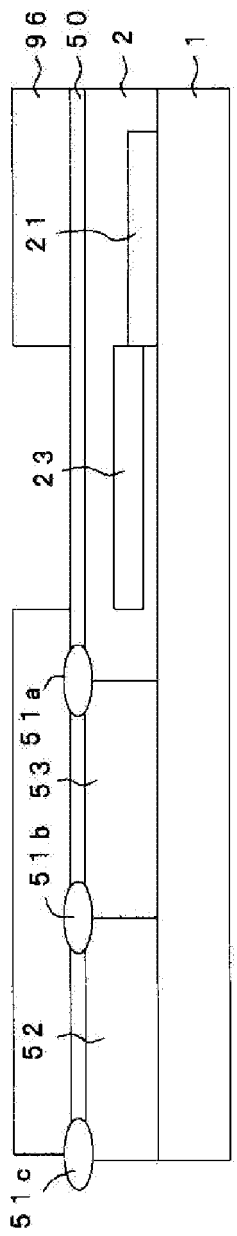
FIG. 7 is a process diagram for illustrating the method of manufacturing an element.

Next, as shown in FIG. 7A, by using a resist mask 96, a P-type buried layer 23 is formed in the modulation transistor forming region in the pixel region, by deeply ion-implanting a P-type impurity.

Figure 7B:
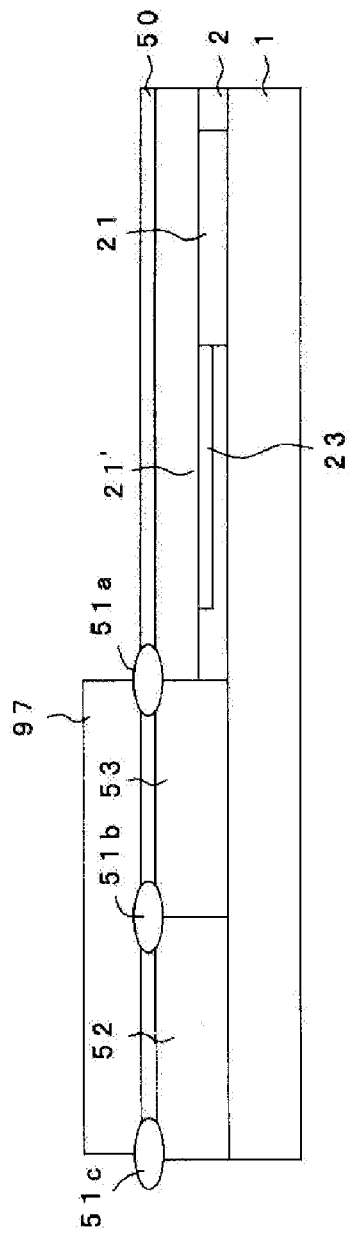

Next, by using a resist mask 97, an N-type well is formed in the entire pixel region on the N-type well 21 by ion-implanting phosphorus in the epitaxial layer 2 (FIG. 7B). Further, as shown in FIG. 7C, by using a resist mask 98, a P-type well 24 is formed on the surface side of the substrate 1, for example, by ion-implanting boron (B) ion in the pixel region.

Figure 7C:
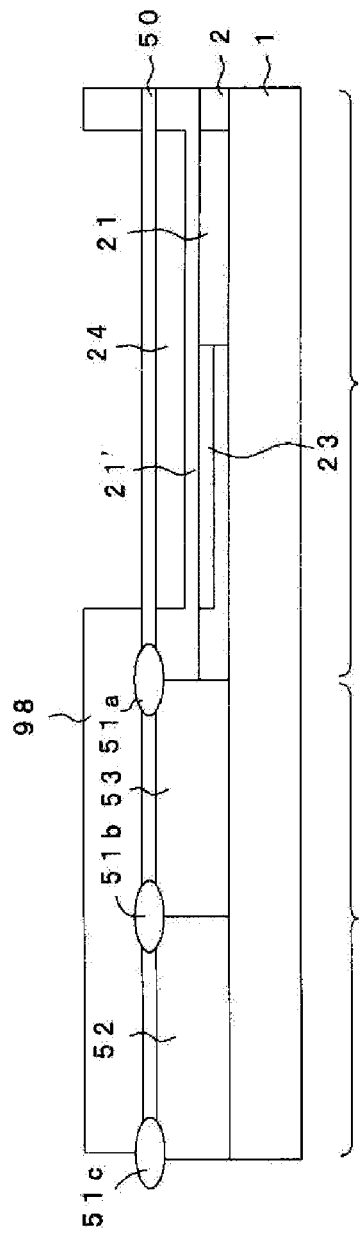

In the pixel region, as shown in FIG. 7C, the N-type well 21 is formed in a deep position in the photo-diode forming region, and in the modulation transistor forming region, restricted by the P-type well 24 and the P-type buried layer 23, a relatively thin N-type well 21' is formed in a relatively shallow position. Meanwhile, the P-type well 24 is formed continuously in an area from the photo-diode forming region to the modulation transistor forming region, and forms the collection well 4 in the photo-diode forming region, and the modulation well 5 in the modulation transistor forming region.

Figure 8A:
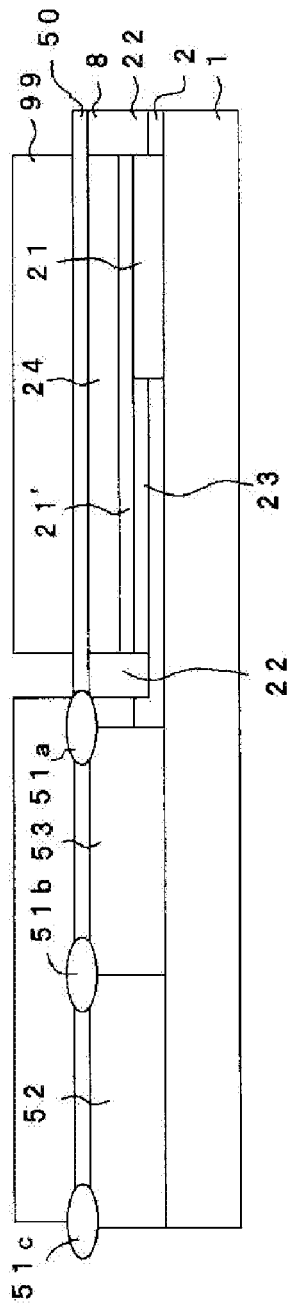
FIG. 8 is a process diagram for illustrating the method of manufacturing an element.
Figure 8B:
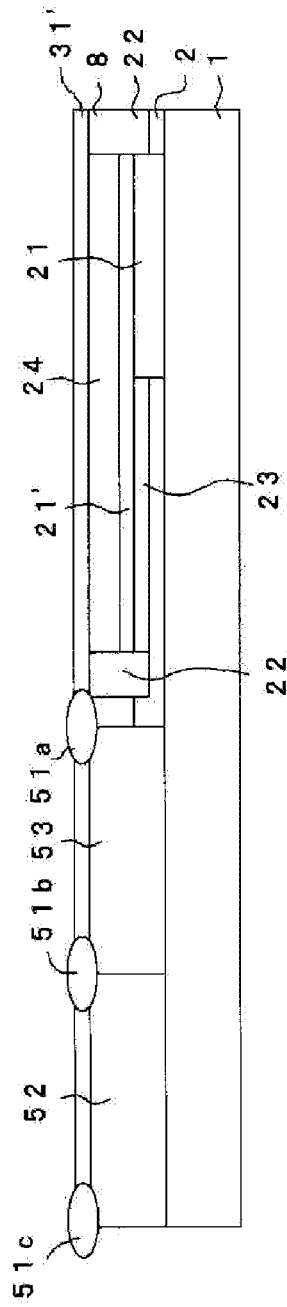

Next, as shown in FIG. 8A, by forming a resist mask 99, the isolation region 22 for isolating elements is formed. Then, as shown in FIG. 8B, by thermal oxidation, a gate oxide film 31' is formed on the substrate 1 surface.

Figure 8C:
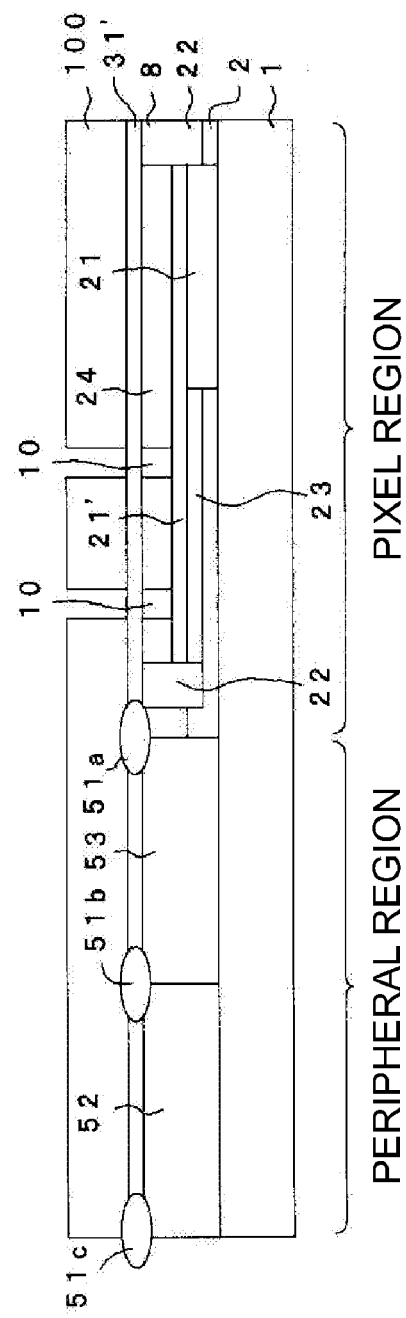

Next, as shown in FIG. 8C, by using a resist mask 100, the carrier pocket 10 by a high concentration P$^+$ diffusion layer is formed in the modulation well 5 under a section forming the ring gate 6. Further, a planar shape of the ring gate 6 is a ring shape.

Next, as shown in FIG. 9A, by using a resist mask 101, an N-type diffusion layer 27 is formed near the substrate 1 surface in the modulation transistor forming region, in order to obtain a channel for the modulation transistor TM.

Next, in order to form a thin gate oxide film for the transistor in the peripheral region, first, as shown in FIG. 9B, by using a mask 102, the gate oxide film 31' in the peripheral region is to be removed. Next, as shown in FIG. 9C, a thin gate oxide film 55 is formed in the peripheral region by thermally oxidizing an entire surface of the substrate 1. Furthermore, in this case, the gate oxide film 31' in the pixel region becomes thick, and thus a gate oxide film 31' is to be obtained.

Next, as shown in FIG. 10A, by forming a resist mask 103 that covers a region other than the NMOS transistor forming region in the peripheral region, a channel 56 is formed by introducing an N-type impurity on the substrate surface in the NMOS transistor forming region. Next, as shown in FIG. 10B, by forming a resist mask 104 that covers a region other than the PMOS transistor forming region in the peripheral region, a channel 57 is formed by introducing a P-type impurity on the substrate surface of the PMOS transistor forming region.

Next, as shown in FIG. 10C, the ring gate 6 of the modulation transistor TM is formed in the pixel region, and each gate 58 and 59 are formed in the CMOS transistor in the peripheral region. These gate 6, gate 58, and gate 59 are formed in a three-layered structure, which for example from the bottom up, the layers consist of a polysilicon layer, a tungsten silicide layer and an insulating layer. Further, a single-layered structure with a conductive material or a two-layered structure with a conductive material and an insulating material may be used for the gate electrode.

Next, as shown in FIG. 11A, the diffusion layer 32 of N-type that also functions as a pinning layer is formed on the substrate surface by using a resist mask 105, which is formed to cover the peripheral region and also to block an opening at the center of the ring gate 6, and the ring gate 6 as masks.

Next, as shown in FIG. 11B, a resist mask 106 which is formed to cover the region other than the NMOS transistor forming region, and by introducing an N-type impurity, a source region and a drain region 60 are formed. Next, as shown in FIG. 11C, a resist mask 107 is formed to cover the region other than the PMOS transistor forming region, and by introducing a P-type impurity, a source region and a drain region 62 are formed.

Figure 12A:
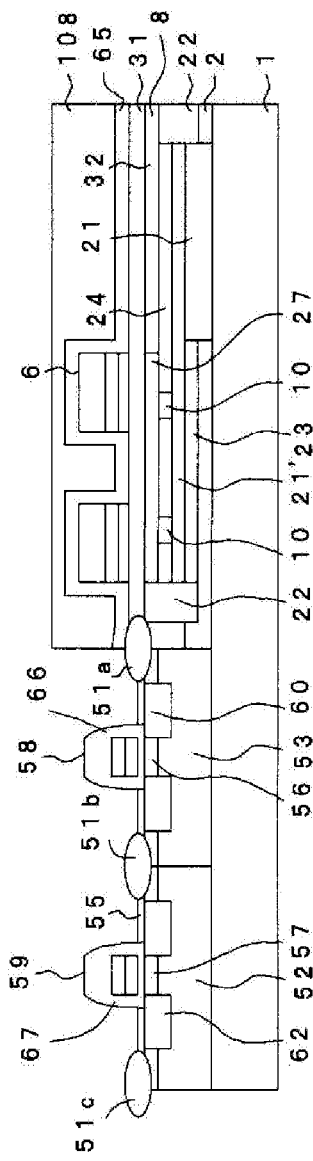
FIG. 12 is a process diagram for illustrating the method of manufacturing an element.

Next, an oxide film is formed on the entire surface of the substrate to form a sidewall, and the sidewall is formed on the side of the gate electrode by performing an anisotropic etching. According to the present embodiment, the sidewall is only formed on the gate electrode of the transistor placed in the peripheral region, and not in the transistor in the pixel region. In other words, the anisotropic etching is performed after covering the entire pixel region by a mask 108. This enables the oxide film on tops and sides of the gates 58 and 59 in the peripheral region to be anisotropically etched, and sidewalls 66 and 67 are formed respectively, on the sides of the gate 58 and 59 (FIG. 12A). Meanwhile, the pixel region is covered by the mask 108, and the etching is not performed towards the oxide film, so that the oxide film to form the sidewall remains as the oxide film 65.

Thus, according to the present embodiment, in the pixel region, as the anisotropic etching is not performed to form the sidewall, the damage to the substrate by etching can be prevented in the pixel region.

Figure 12B:
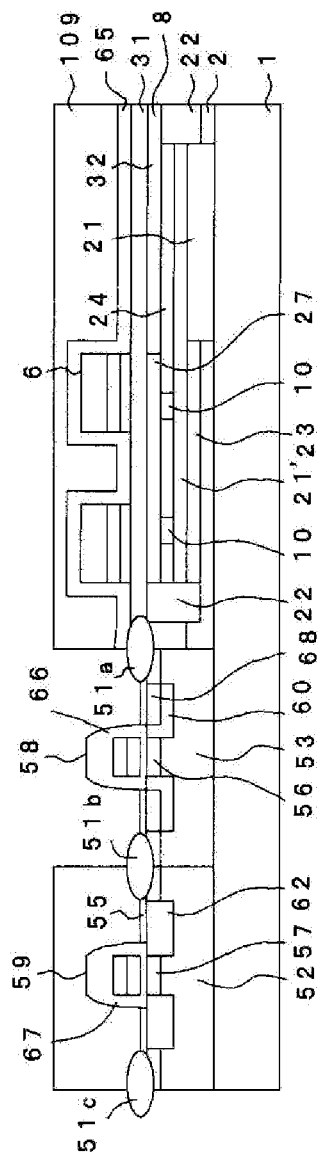

Next, as shown in FIG. 12B, by using a mask 109 that covers other than the NMOS transistor forming region, an N-type impurity is injected to the substrate surface in self-alignment from the gate 58 and the sidewall 66. The contact layer 68 is formed herewith.

Figure 12C:
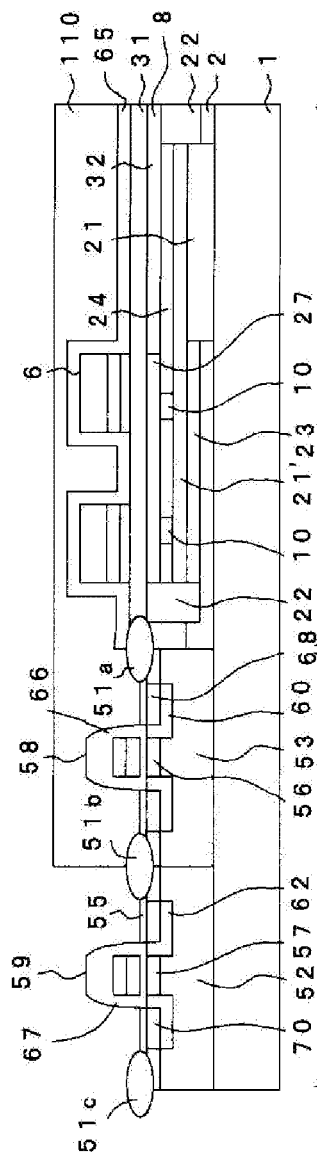

Next, as shown in FIG. 12C, by using a mask 110 that covers other than the PMOS transistor forming region, a P-type impurity is injected to the substrate surface in self-alignment from the gate 59 and the sidewall 67. A contact layer 70 is formed herewith.

Figure 13A:
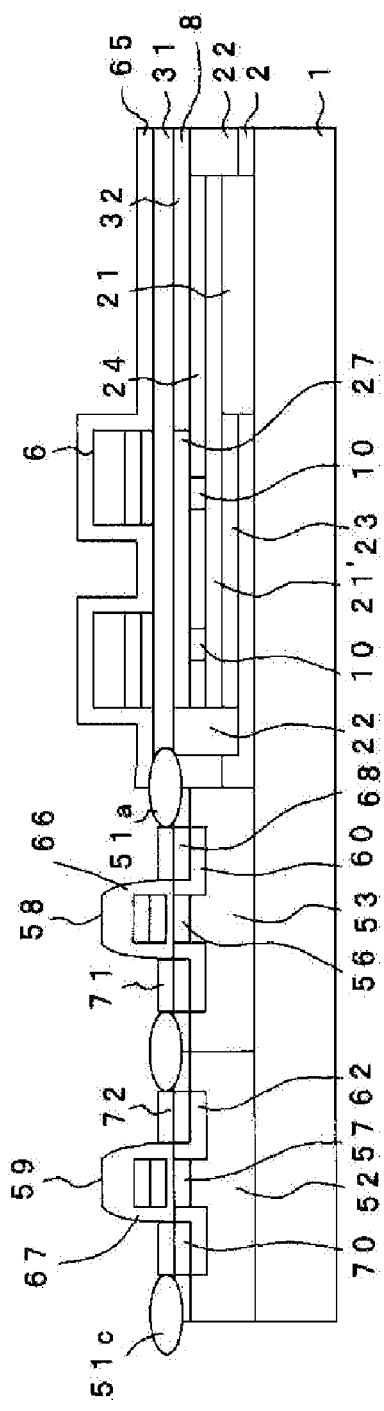
FIG. 13 is a process program for illustrating the method of manufacturing an element.

Next, as shown in FIG. 13A, in the source region of the NMOS transistor forming region in the peripheral region, the metal material 71 is formed to be silicided to lower a contact resistance to the drain region 60. Also, to reduce the contact resistance to a source region and a drain region 62 of the PMOS transistor forming region in the peripheral region, the metal material 72 is formed to be silicided.

Figure 13B:
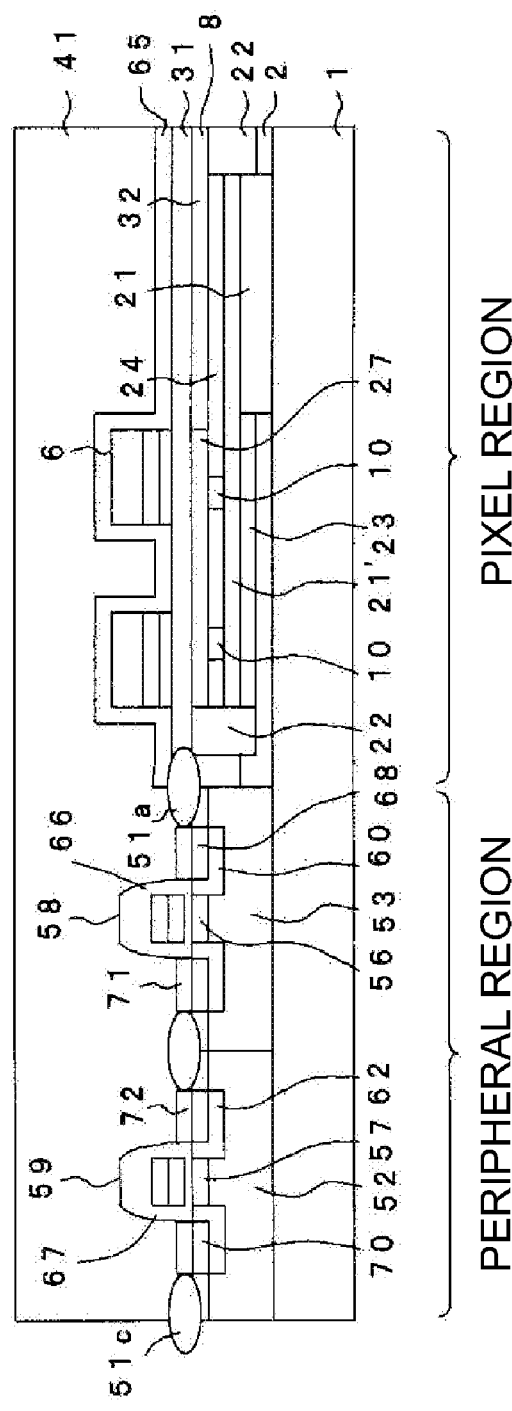
Figure 14A:
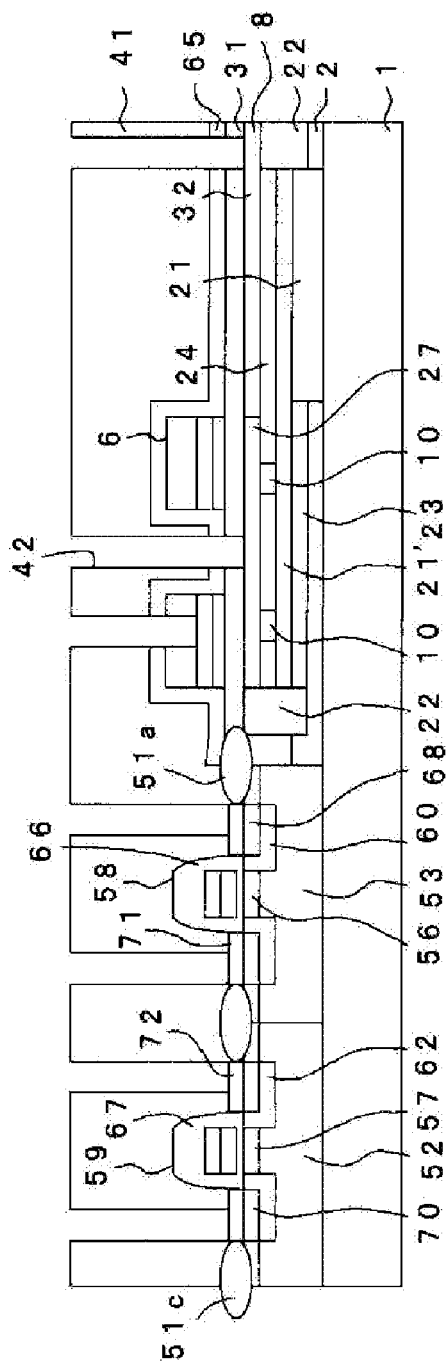
FIG. 14 is a process program for illustrating the method of manufacturing an element.

Next, as shown in FIG. 13B, an interlayer insulation film 41 is formed on the substrate surface. Further, as shown in FIG. 14A, a contact hole 42 is formed on the interlayer insulation film 41. For example, in the peripheral region, a contact hole that reaches metal materials 71 or 72 which electrically couple the source region or the drain region is formed. Furthermore, in the pixel region, a contact hole that reaches the ring gate 6, and a contact hole that reaches the source region 7 or the drain region 8 are formed. Meanwhile, while forming the contact hole 42, the gate oxide film 31 and the oxide film 65 in an aperture portion are to be removed at the same time.

Figure 14B:
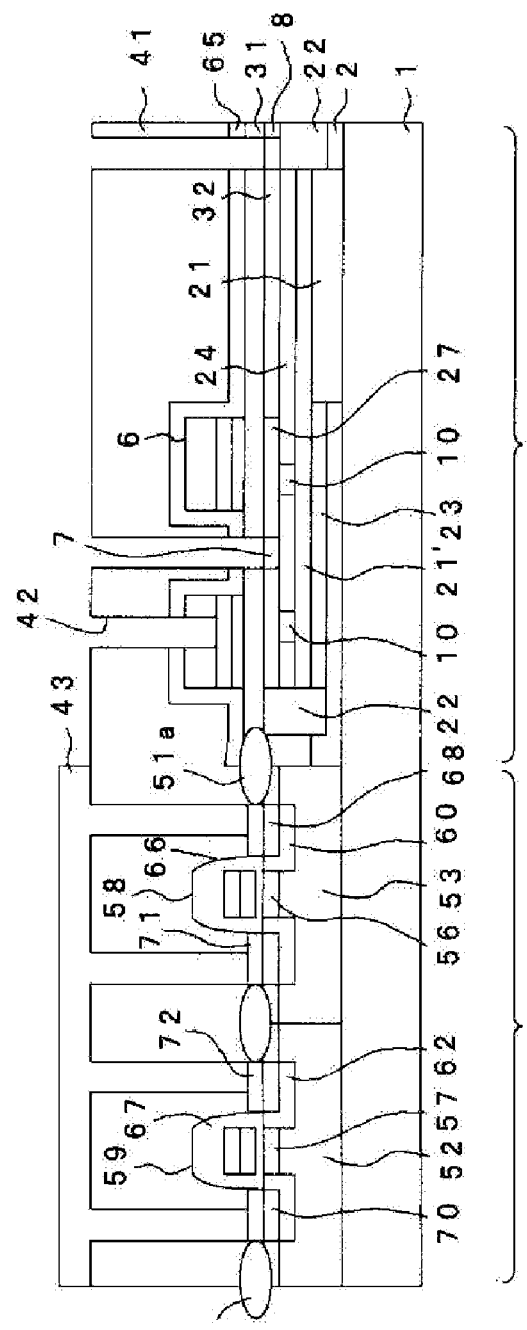
Figure 15:
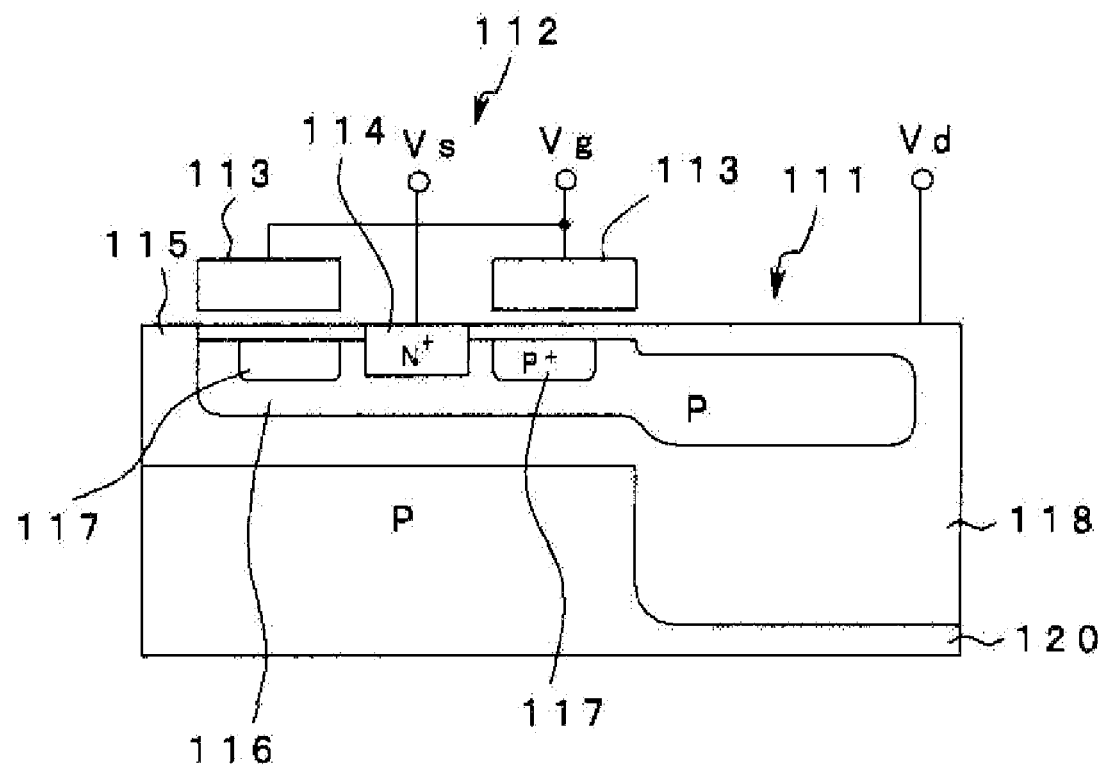
FIG. 15 is schematically showing the image sensor disclosed in Japanese Unexamined Patent Publication No. 2001-177085.

Next, as shown in FIG. 14B, by ion-implanting to the substrate surface through the contact hole 42, the source region 7 and a drain contact 8a are formed.

Effects of the Present Embodiment

According to the present embodiment, the sidewall is only formed at the gate of the transistor in the peripheral region, and the sidewall is not formed at the gate of the transistor in the pixel region. In other words, etching is not performed in the pixel region, and the oxide film which becomes a material for the sidewall remains as it is. By doing so, in the pixel region, a damage to the substrate by etching is prevented and defects do not occur in the sensor cell.

Meanwhile, according to the above embodiment, an example was applied to a threshold modulation type solid-state imaging device, but it is clear that this may also be applied to other imaging devices such as a CMOS type and so forth.

What is claimed is:

1. A solid-state imaging device, comprising:
   a photoelectric conversion element;
   a pixel region including a modulation part formed adjacent to the photoelectric conversion element; and
   a peripheral region in which a peripheral circuit including a driving circuit driving the photoelectric conversion element and the modulation part is disposed, wherein the peripheral region includes a transistor that a sidewall is formed on a side of a gate electrode; and
   wherein the pixel region includes:
   a transistor that no sidewall is formed on a side of a gate electrode;
   a substrate of one conductivity type;
   a first impurity layer of a reverse conductivity type formed on the substrate;
   a second impurity layer of one conductivity type formed on the first impurity layer in a forming region of the photoelectric conversion element;
   a third impurity layer of one conductivity type formed on the first impurity layer in a forming region of the transistor, photo-generated charges being transferred to the third impurity layer from the second impurity layer;
   a gate electrode formed above the third impurity layer above the substrate, the gate electrode having an opening and no sidewall on a side thereof;
   a source formed on a surface side of the substrate in the opening; and
   a drain formed apart from the source and electrically coupled to the first impurity layer.

2. The solid-state imaging device according to claim 1, wherein the gate electrode is formed in a ring-shape.

3. The solid-state imaging device according to claim 1, further comprising:
   a fourth impurity layer formed under the gate electrode in the third impurity layer so as to be highly doped than the third impurity layer.

* * * * *